United States Patent [19]

Collier

[11] 4,167,676

[45] Sep. 11, 1979

[54] VARIABLE-SPOT SCANNING IN AN ELECTRON BEAM EXPOSURE SYSTEM

[75] Inventor: Robert J. Collier, New Providence, N.J.

[73] Assignee: Bell Telephone Laboratories, Incorporated, Murray Hill, N.J.

[21] Appl. No.: 879,097

[22] Filed: Feb. 21, 1978

[51] Int. Cl.² .............................................. A61K 27/02
[52] U.S. Cl. ................................. 250/492 A; 250/398; 250/492 B
[58] Field of Search ................ 250/398, 492 A, 492 B

[56] References Cited
U.S. PATENT DOCUMENTS

| | | | |
|---|---|---|---|
| 2,802,110 | 8/1957 | Kazato et al. ........................ | 250/398 |
| 3,875,416 | 4/1975 | Spicer et al. ...................... | 250/492 A |
| 3,876,883 | 4/1975 | Broers ................................. | 250/398 |

Primary Examiner—Harold A. Dixon
Attorney, Agent, or Firm—Lucian C. Canepa

[57] ABSTRACT

An attractive high-throughput technique for writing microcircuit patterns with a scanning electron spot of variable size is described in application Ser. No. 855,608, filed Nov. 29, 1977. In such an electron beam exposure system, two spaced-apart apertured mask plates with a deflector therebetween are included in the electron column of the system. As described herein, a third apertured mask plate and an associated deflector are serially added to the aforenoted components in the column. In this way, the throughput and other performance characteristics of such a system are significantly enhanced.

16 Claims, 16 Drawing Figures

VARIABLE-SPOT SCANNING IN AN ELECTRON BEAM EXPOSURE SYSTEM

TECHNICAL FIELD

This invention relates to an apparatus and a method for fabricating microminiature devices and, more particularly, to a variable-spot scanning technique for use in an electron beam exposure system designed for fabricating large-scale-integrated devices.

BACKGROUND ART

It is known to increase the pattern-writing speed of an electron beam exposure system (EBES) by varying the writing spot dimensions of the electron beam during the process of scanning the beam over the surface of a resistcoated workpiece. Such a variable-spot scanning technique is described in a commonly assigned copending application, Ser. No. 855,608, filed Nov. 29, 1977. In one specific illustrative mode of operation of the described system, two spaced-apart mask plates in the electron column of the system contain respectively different apertures therethrough. By interposing a high-speed deflector between the mask plates, it is feasible to rapidly deflect the image of the first electron-beam-illuminated aperture thereby to alter the portion of the second aperture that is illuminated by the beam. In turn, the beam propagated through the second aperture is demagnified to form a variable-size writing spot on the surface of a resist-coated workpiece.

In one particular embodiment described in the aforecited copending application, four scan lines at a time are traversed by the beam in a raster mode of operation. At each address position along such a four-line-at-a-time scan, any specified one of sixteen different combinations (each comprising zero through four electron spots) is formed by the mask plate apertures and transmitted to the workpiece surface. In that way, the pattern-writing speed of an EBES system is significantly increased.

Considerable interest exists on the part of workers in the microelectronics field in trying to still further increase the throughput capabilities of an EBES-type machine. In attempting to achieve this goal with the aforedescribed two-mask-plate system, the swath width or the number of scan lines traversed during one scan may be increased. But, as this width is increased, the size and complexity of the aperture configurations in the mask plates tend as a practical matter to become excessive and the design of the illumination system becomes more complicated. Moreover, as this width is increased, the number of address positions over which the image of the first aperture must be deflected to achieve different variable-spot combinations also becomes excessive. In turn, this complicates the deflection system design and entails longer deflection times, which are undesirable because they impose a limitation on the overall operating speed of the system.

SUMMARY OF THE INVENTION

Accordingly, an object of the present invention is an improved scanning technique for an electron beam exposure system.

More specifically, an object of this invention is a variable-spot scanning technique that improves the throughput and other operating characteristics of an electron beam lithographic system.

Briefly, these and other objects of the present invention are realized in a specific illustrative electron column designed for variable-spot scanning. Such a column comprises three spaced-apart apertured mask plates. A first high-speed deflector is interposed between the first and second mask plates, and a second high-speed deflector is positioned between the second and third plates. The aperture in the first plate is fully illuminated with an electron beam. The image of that illuminated aperture is then selectively deflected with respect to the aperture in the second plate. In turn, the image propagated through the second plate is selectively deflected with respect to the aperture in the third plate. Finally, the resulting image transmitted through the third plate is demagnified to form a writing spot on the surface of a workpiece. In that way, a variable-size electron spot is generated in a high-speed manner to facilitate precision patterning of an electron-sensitive medium.

BRIEF DESCRIPTION OF THE DRAWING

A complete understanding of the present invention and of the above and other objects may be gained from a consideration of the following detailed description presented hereinbelow in connection with the accompanying drawing, in which.

DETAILED DESCRIPTION

Figure 1:
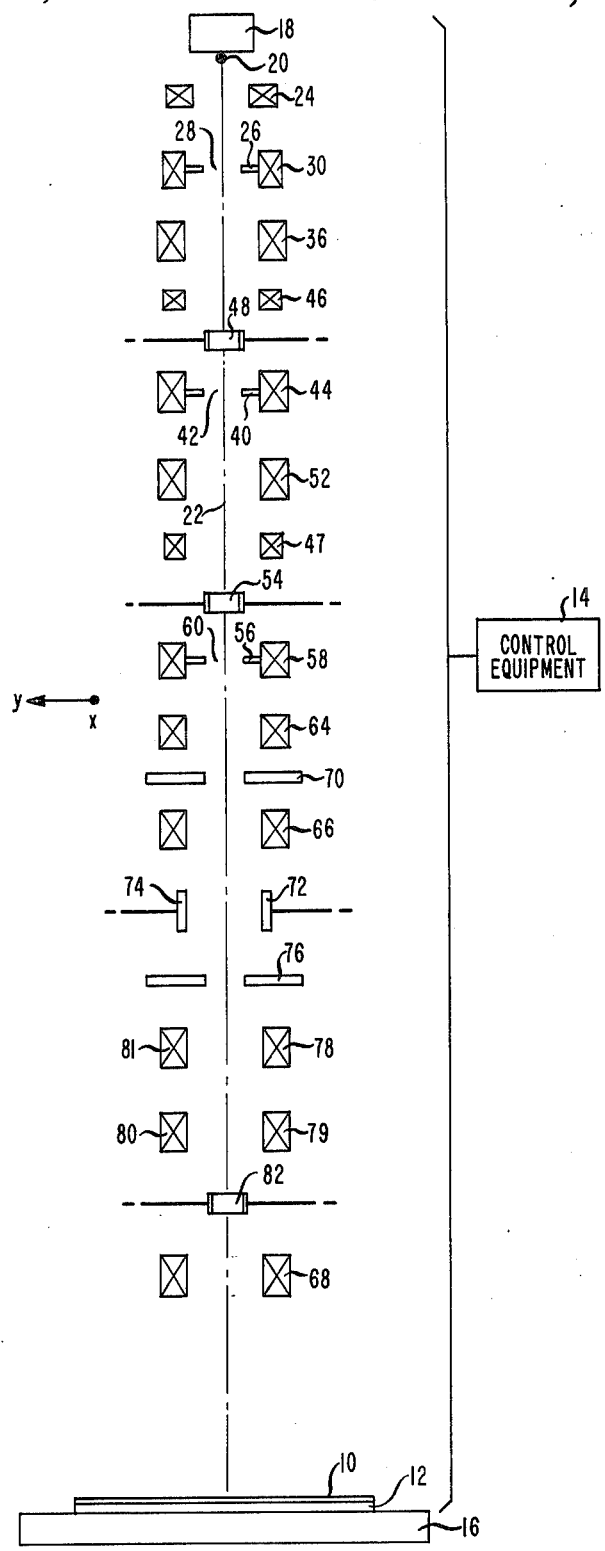
FIG. 1 is a diagrammatic representation of a specific illustrative electron beam exposure system made in accordance with the principles of the present invention.

FIG. 1 depicts a specific illustrative lithographic apparatus for controllably moving a variable-size electron spot to any designated position on the top surface of an electron-sensitive layer 10 supported on a substrate 12. In turn, the substrate 12 is mounted on a conventional x-y-movable table 16.

Various positive and negative electron-sensitive materials suitable for use as the layer 10 are well known in the art. By selectively scanning the electron spot over the surface of the layer 10 in a highly accurate and high-speed manner, it is possible to make integrated circuit masks or to write directly on a coated wafer to fabricate extremely small and precise low-cost microminiature devices. Some suitable electron-sensitive materials for use as the layer 10 are described, for example, in a two-part article by L. F. Thompson entitled "Design of Polymer Resists for Electron Lithography",

*Solid State Technology*, part 1: July 1974, pages 27–30; parts 2: August 1974, pages 41–46.

The electron beam apparatus of FIG. 1 may be considered to comprise two main constituents. One is the column itself and the other is equipment 14 connected to the column for controlling the operation of various elements in the column. The column is characterized by highly accurate high-speed deflection and blanking capabilities generally similar to those exhibited by the columns described in U.S. Pat. No. 3,801,792, issued Apr. 2, 1974 to L. H. Lin, in U.S. Pat. No. 3,900,737, issued Aug. 19, 1975 to R. J. Collier and D. R. Herriott, and in the aforecited copending application. But, in accordance with the principles of the present invention, the column depicted in FIG. 1 is further characterized by a variable-spot-size scanning capability that is a significant and unique extension of the technique described in the Collier-Thomson application. This extended capability in particular will be described in detail below.

The other main constituent of the FIG. 1 apparatus comprises control equipment 14. Illustratively, the equipment 14 is of the type described in the aforecited Collier-Herriott patent. The equipment 14 supplies electrical signals to the described column to systematically control deflecting, scanning and blanking of the electron beam. Moreover, the equipment 14 supplies control signals to the x-y table 16 to mechanically move the work surface 10 during the electron beam scanning operation, in a manner now well known in the art.

The specific illustrative electron column of FIG. 1 includes a conventional electron source 18. For example, the source 18 comprises a standard lanthanum boride electron emitter. In the immediate downstream vicinity of the source 18, the trajectories of electrons emanating from the source 18 go through a so-called crossover or source image point 20 which, for example, is about 50 micrometers in diameter. Thereafter the electron paths successively diverge and converge as the electrons travel downstream along longitudinal axis 22 toward the work surface 10.

Illustratively, the electron column of FIG. 1 includes standard coils 24 by means of which the electron trajectories emanating from the crossover point 20 may be exactly centered with respect to the longitudinal axis 22. Thereafter the electron beam is directed at a mask plate 26 which contains a precisely formed aperture 28 therethrough. (Actually, in the first of several specific illustrative embodiments to be described hereinbelow, the aperture 28 comprises four separate spaced-apart apertures. In other embodiments, however, the aperture 28 comprises only a single opening. Thus, the schematic depiction in FIG. 1 of the mask plate 26 is to be regarded as a general representation of a plate having either a single or multiple apertures therethrough.) The beam is designed to uniformly illuminate the full extent of the opening or aperture 28 in the plate 26 and to appear on the immediate downstream side of the plate 26 with a cross-sectional area that corresponds exactly to the configuration of the aperture 28.

By way of example only, the mask plate 26 of FIG. 1 is shown mounted on and forming an integral unit with an electromagnetic field lens 30. Inclusion of the lens 30 in the FIG. 1 column is not always necessary. And, even when included, the lens 20 may if desired be separate and distinct from the plate 26. If included, the lens 30 is not usually designed to magnify or demagnify the cross-sectional configuration of the electron beam on the downstream side of the plate 26. But, in combination with a next subsequent downstream lens, to be described later below, the lens 30 serves to maximize the transmission of electrons along the depicted column and to selectively control the locations of successive crossover points on the axis 22.

Figure 2:
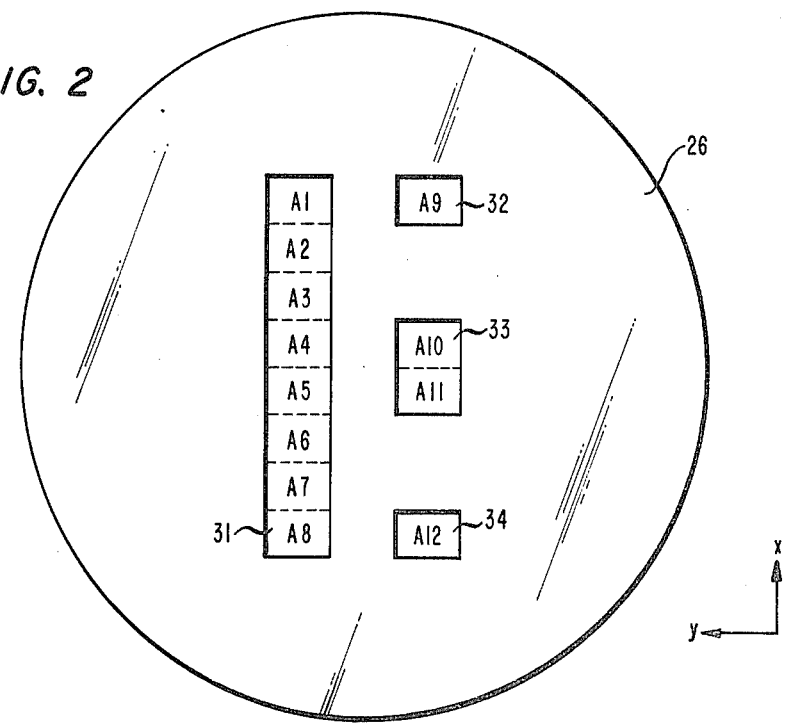
FIGS. 2 through 4 are specific illustrative depictions of the respective geometries of three apertured mask plates included in the electron beam column of the FIG. 1 system.

A bottom view of one advantageous geometry for the apertured mask plate 26 of FIG. 1 is shown in FIG. 2. Illustratively, in accordance with one specific illustrative embodiment made in accordance with the principles of the present invention, the plate 26 comprises a disc of molybdenum in which four apertures 31 through 34 are formed in a high-precision way by, for example, conventional laser machining techniques.

The dashed lines within the openings 31 and 33 of FIG. 2 are included simply to facilitate subsequent discussion. In actuality, of course, each of the openings 31 and 33 is a single continuous aperture having straight edges as indicated by the solid straight lines. Thus, the aperture 31 may be regarded as composed of eight basic rectangular segments each defined by two or three solid straight lines and one or two dashed straight lines. Similarly, the aperture 33 may be regarded as composed of two basic rectangular segments each defined by three solid straight lines and a common dashed straight line. Each of the apertures 32 and 34 comprises a single basic rectangular segment.

In FIG. 2 the segments included in the aperture 31 are designated A1 through A8. The aperture 32 comprises segment A9, the aperture 33 comprises segments A10 and A11, and the aperture 34 comprises segment A12. In one particular illustrative embodiment of the present invention, each of the rectangles A1 through A12 measures 100-by-200 micrometers ($\mu$m). When the plate 26 of FIG. 2 is mounted in the FIG. 1 column, the longitudinal axis 22 of the column is perpendicular to and extends through the midpoint of the square formed by the segments A4 and A5 shown in FIG. 2.

The cross-sectional configuration of the electron beam that passes through the mask plate 26 of FIG. 1 is determined by the geometry of the apertures 31 through 34. In turn, this beam configuration propagates through a conventional electromagnetic lines 36 (for example, an annular coil with iron pole pieces) which forms an image of the aforedescribed apertures on a second mask plate 40. The plate 40 contains a precisely formed aperture 42 and, illustratively, is mounted on and forms an integral unit with electromagnetic field lines 44.

A predetermined quiescent registration of the image of the aperture(s) in the mask plate 26 on the plate 40 of FIG. 1 is assured by, for example, including registration coils 46 in the depicted column.

The location of the image of the electron-beam-illuminated aperture(s) 26 on the second mask plate 40 of FIG. 1 is selectively controlled in a high-speed way during the time in which the electron beam is being scanned over the work surface 10. This is done by means of deflectors 48 positioned, for example, as shown in FIG. 1 to move the beam in the x and/or y directions. Advantageously, the deflectors 48 comprise two pairs of orthogonally disposed electrostatic deflection plates. Electromagnetic deflection coils may be used in place of the electrostatic plates, but this usually leads to some loss in deflection speed and accuracy. Whether electrostatic or electromagnetic deflection is employed, the deflectors 48 may also be utilized to achieve registration of the image of the aperture(s) in the plate 26 on the second mask plate 40. This is done by applying a steady-state centering signal to the deflectors 48. In that case the separate registration coils 46 may, of course, be omitted from the column.

Figure 3:
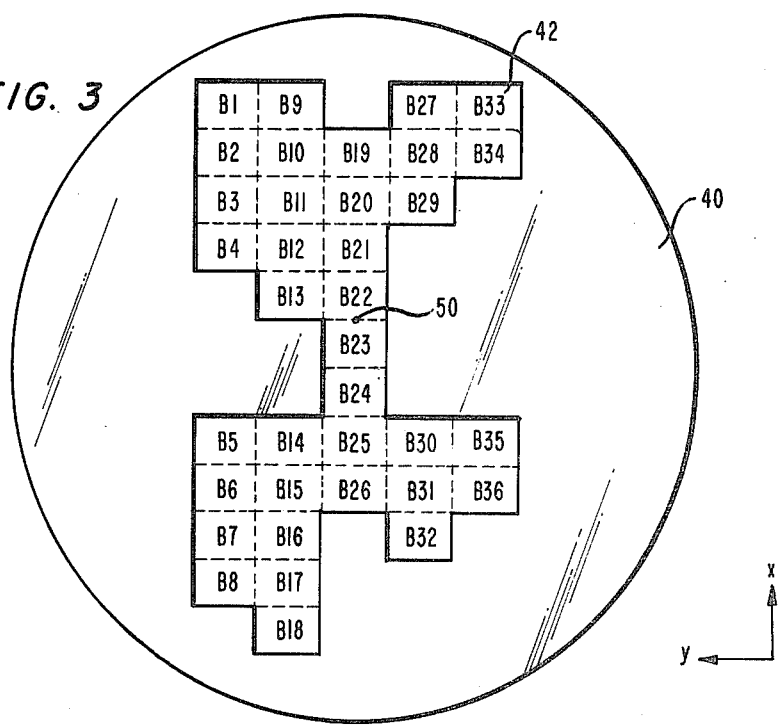

In one specific illustrative embodiment of the principles of this invention, the aperture 42 formed in the second mask plate 40 has the particular configuration shown in FIG. 3, which is a bottom view of the plate 40 included in the FIG. 1 column. For subsequent ease of discussion, the opening 42 is represented as being divided into multiple constituent rectangular segments designated B1 through B36. In one particular embodiment of this invention, each such segment measures 100-by-200 $\mu$m. Centrally located dot 50 in FIG. 3 indicates the location of the longitudinal axis 22 of FIG. 1.

Quiescently, that is, in the absence of deflection signals applied to the unit 48 of FIG. 1, images of the apertures 31, 32 and 34 of the mask plate 26 (see FIG. 2) are transmitted through portions of the aperture 42 of the plate 40 of FIG. 3. Illustratively, the aperture image projected by the lens 36 (FIG. 1) onto the plate 40 corresponds exactly in size with the dimensions of the apertures 31 through 34. (If desired, the lens 36 may, of course, be designed to achieve other than a 1:1 projection of the apertures 31 through 34. Or, in some cases of practical interest, the lens 36 may be omitted altogether.) By means of the coils 46, the image so projected is precisely centrally registered on the plate 40. More specifically, in that central or quiescent registration, the image of the aperture 31 corresponds exactly in size and directly overlies the portion of the aperture 42 composed of segments B19 through B26. Accordingly, the image defined by segments A1 through A8 is transmitted in its entirety through the mask plate 40. In addition, the images of the apertures 32 and 34 directly overlie the segments B34 and B36, respectively, of the aperture 42 and are, accordingly, also quiescently transmitted through the plate 40. But, quiescently, the image of the aperture 33 is projected onto a nonapertured portion of the plate 40 and, hence, is not propagated through the plate 40.

In accordance with the principles of the present invention, the electron image transmitted through the mask plate 40 of FIG. 1 propagates downstream through electromagnetic lens 52 and deflectors 54 to impinge on a third apertured mask plate 56, which is, for example, mounted on field lens 58 to form an integral unit therewith. Plate 56 includes aperture 60 therethrough.

In the absence of signals applied to the deflectors 54, the aforedescribed quiescent image transmitted through segments B19 through B26, B34 and B36 of FIG. 3 is projected onto the mask plate 56 to achieve a quiescent registration therewith. (For this purpose, registraton coils 47 may advantageously by included in the column of FIG. 1.) In that condition, the image emanating from the segments B19 through B26 of the aperture 42 of FIG. 3 directly overlies the aperture 60 in the mask plate 56 of FIG. 4 and is, accordingly, quiescently transmitted through the plate 56.

Figure 4:
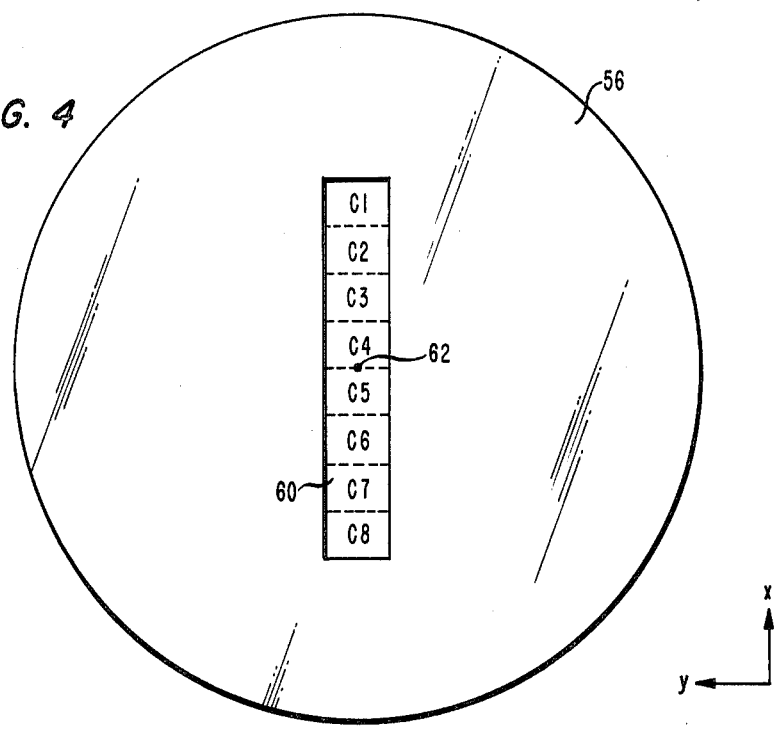

In FIG. 4, the aperture 60 is indicated as being divided into eight equal-sized rectangular segments designated C1 through C8. In one particular embodiment of this invention, each such segment measures 100-by-200 $\mu$m. Centrally located dot 62 in FIG. 4 indicates the location of the longitudinal axis 22 of FIG. 1.

The cross-sectional area of the electron beam transmitted through the apertured plate 56 of the electron column of FIG. 1 is subsequently demagnified. This is done by means of three conventional electromagnetic lenses 64, 66 and 68 positioned downstream of the plate 56. In one specific illustrative embodiment of the principles of the present invention, these lenses are designed to achieve an overall demagnification of the beam propagated therethrough by a factor of 400. More particularly, these lenses are selected to demagnify the aforementioned cross-sectional area of the beam transmitted by the mask plate 56 and to image a reduced counterpart thereof on the work surface 10. For an overall demagnification of 400, and for the specific illustrative case in which the cross-section of the beam immediately downstream of the plate 56 measures 200-by-800 $\mu$m, the electron spot imaged on the surface 10 will quiescently be a rectangle 0.5 $\mu$m wide and 2.0 $\mu$m high.

The other elements included in the column of FIG. 1 are conventional in nature. Except for one deflector unit, these elements may, for example, be identical to the corresponding parts included in the columns described in the aforecited patents and application. These elements include a beam-limiting apertured plate 70, electrostatic beam blanking plates 72 and 74, an apertured blanking stop plate 76 and electromagnetic deflection coils 78 through 81.

If the beam blanking plates 72 and 74 of FIG. 1 are activated, the electron beam propagating along the axis 22 is deflected to impinge upon a nonapertured portion of the plate 76. In that way the electron beam is blocked during prescribed intervals of time from appearing at the surface 10. If the beam is not so blocked, it is selectively deflected by the coils 78 through 81 to appear at any desired position in a specified subarea of the work surface 10. Access to other subareas of the surface 10 is gained by mechanically moving the surface by means, for example, of a computer-controlled micromanipulator, as is known in the art.

In addition, the column of FIG. 1 includes deflectors 82. The purpose of these deflectors will be described later below.

The column shown in FIG. 1 may be controlled by equipment 14 to operate in its so-called raster-scan mode of operation. This mode, which is described in the aforecited Collier-Herriott patent and in the Collier-Thomson application, involves successively scanning the beam on the work surface 10 along parallel equally spaced-apart scan lines. Illustratively, each such scan line may be considered to comprise multiple equally spaced-apart address positions. At each address position during traversal of a scan line, the electron beam is blanked or not in the manner described above. Additionally, in accordance with the principles of the present invention, the area of the beam that impinges upon the work surface 10 at each address position is selectively controlled.

As the variable-size electron spot is deflected along a row of the scan field, the spot is intensity modulated by the beam blanking plates 72 and 74 at, for example, a 20 megahertz rate. This modulation rate corresponds with a single-address exposure time of 50 nanoseconds, which is compatible with the sensitivities of available electron resist materials.

In the particular illustrative example specified herein, the maximum size of the rectangular electron spot imaged onto the surface of the layer 10 of FIG. 1 is, as specified above, 0.5 $\mu$m wide and 2.0 $\mu$m high. For this particular case, the aforementioned scan lines in the raster mode of operation are usually spaced apart 2 $\mu$m from each other and successive address positions along a scan line are spaced 0.5 $\mu$m apart.

Figure 6:
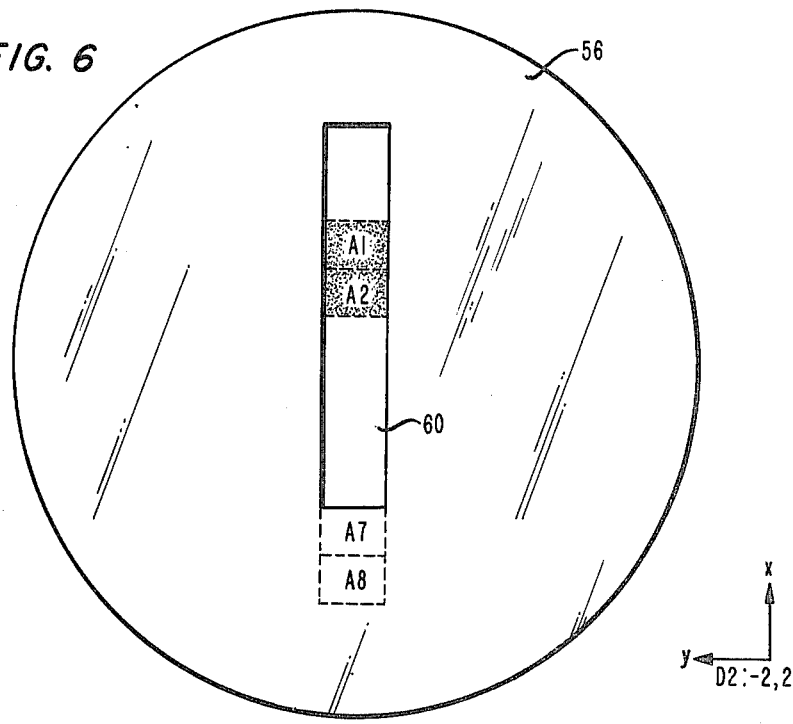
FIG. 6 shows the FIG. 4 mask plate with a deflected version of the particular image depicted in FIG. 5 superimposed thereon.
Figure 7:
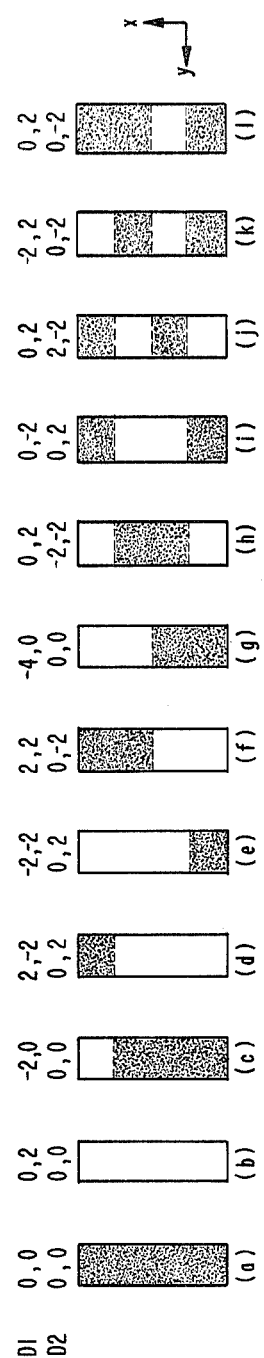
FIGS. 7 through 12 represent sixty-seven different electron spot configurations emanating from the FIG. 4 mask plate as a result of selectively deflecting the images produced by the plates of FIGS. 2 and 3.
Figure 8:
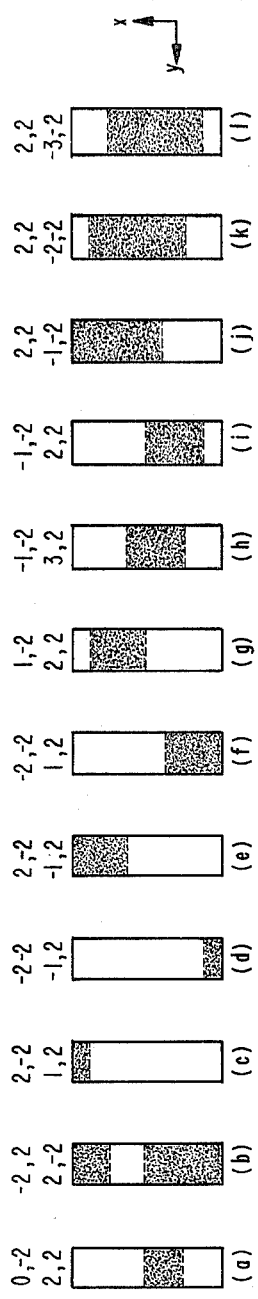
Figure 9:
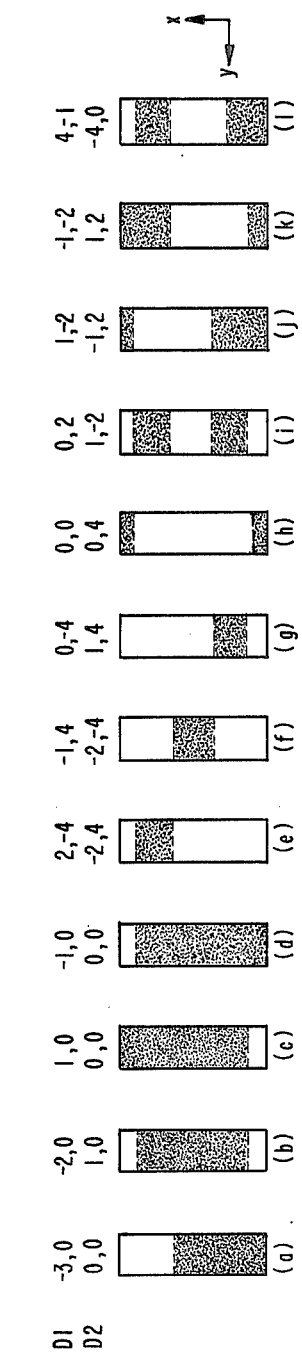
Figure 10:
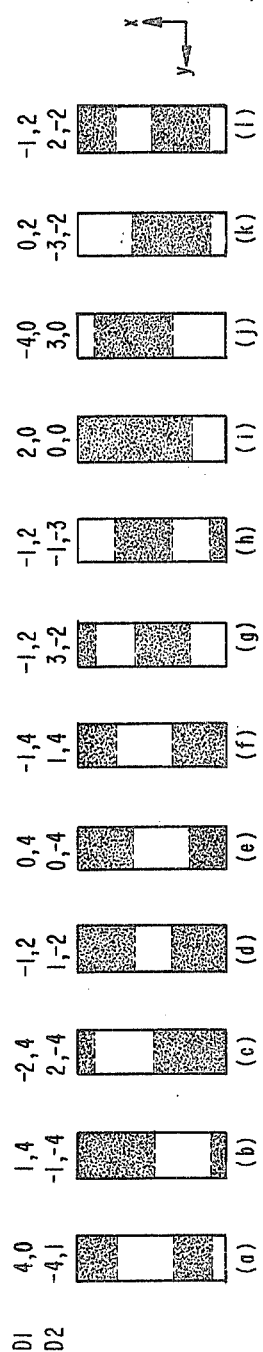
Figures 11, 12:
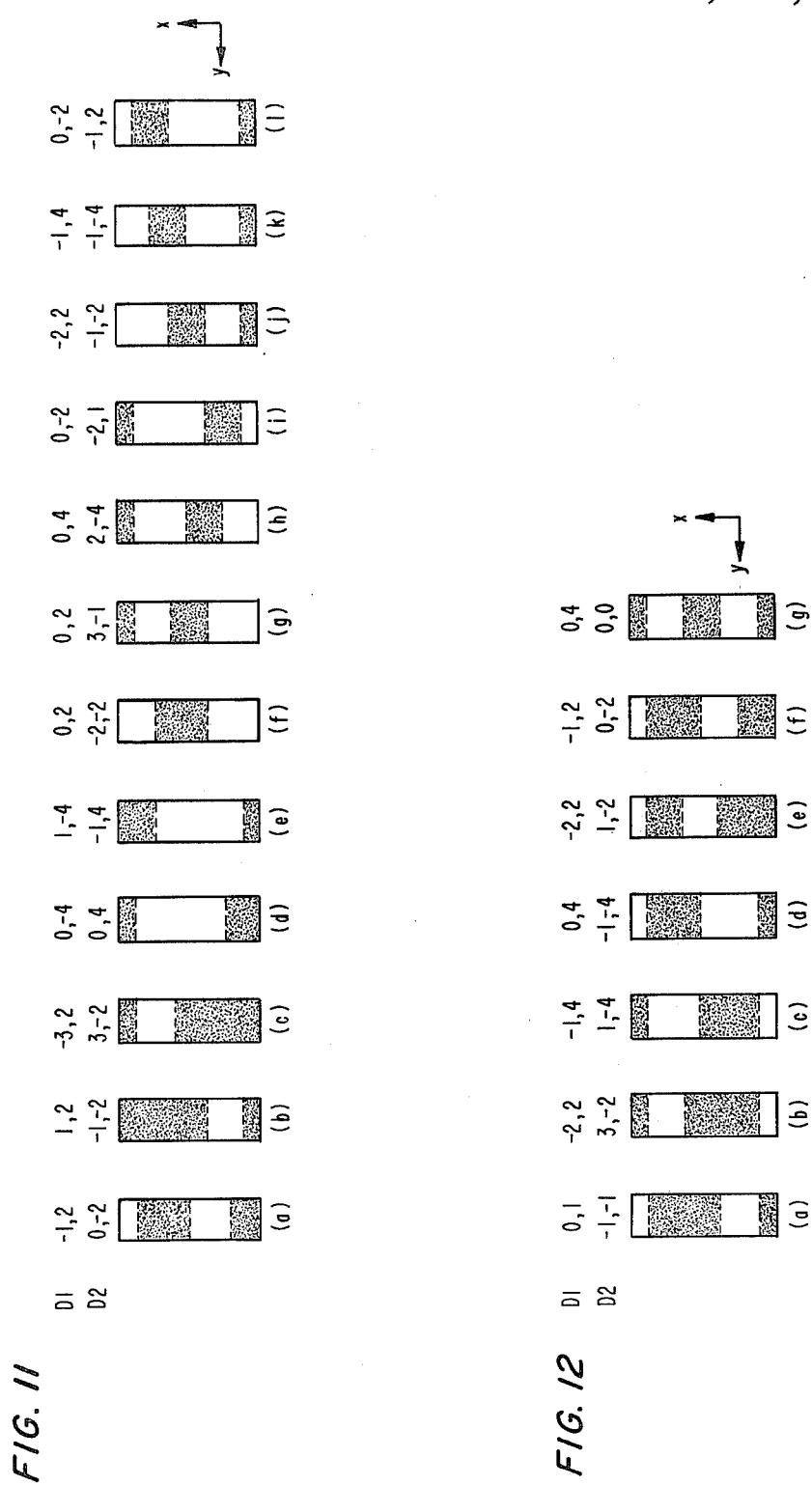

For purposes of a specific example, it will be assumed that the system represented in FIG. 1 is programmed to form any one at a time of sixty-eight different electron spot configurations. In accordance with the principles of this invention, this is done by selectively applying signals to the deflection units 48 and 54. The result of applying no deflection signals (i.e., an all-zero deflection set) to these units was specified above in connection with the description of FIGS. 2 through 4 and is represented in FIG. 7(a). The result of applying one other particular set of deflection signals to the units 48 and 54 will be specified immediately below with the aid of FIGS. 5 and 6. Further, the sixty-six additional different spot configurations achievable by respectively applying sixty-six other deflection signal sets to these units will be specified below in connection with the representations of FIGS. 7 through 12.

By means of the deflection unit 48 shown in FIG. 1, the image transmitted through the apertured mask plate 26 and projected onto the plate 40 can be deflected in the X and/or Y directions. Assume, for example, that, with respect to the x and y axes shown in FIG. 5, the transmitted image is deflected zero half-address positions in the positive x direction and two half-address positions in the negative y direction. The resulting registration of the A1 through A12 image with respect to the aperture 42 in the mask plate 40 is indicated in FIG. 5.

As specified above, successive address positions are illustratively spaced apart 0.5 $\mu$m on the surface of the workpiece 10. Accordingly, a so-called half-address position equals a distance of 0.25 $\mu$m on the workpiece 10 and 100 $\mu$m in the plane of the mask plate 40 or in the plane of the plate 56.

Hereinafter, the x,y deflection imparted to the electron beam by the deflection unit 48 will be designated D1:x,y, where x and y are integers indicating the number of half-address positions that the beam configuration has been moved in the x and y directions, respectively. Accordingly, in FIG. 5 the designation D1:0,−2 has been included to represent the particular aforespecified deflection amplitude imparted to the image transmitted through the plate 26 and projected onto the plate 40.

Figure 5:
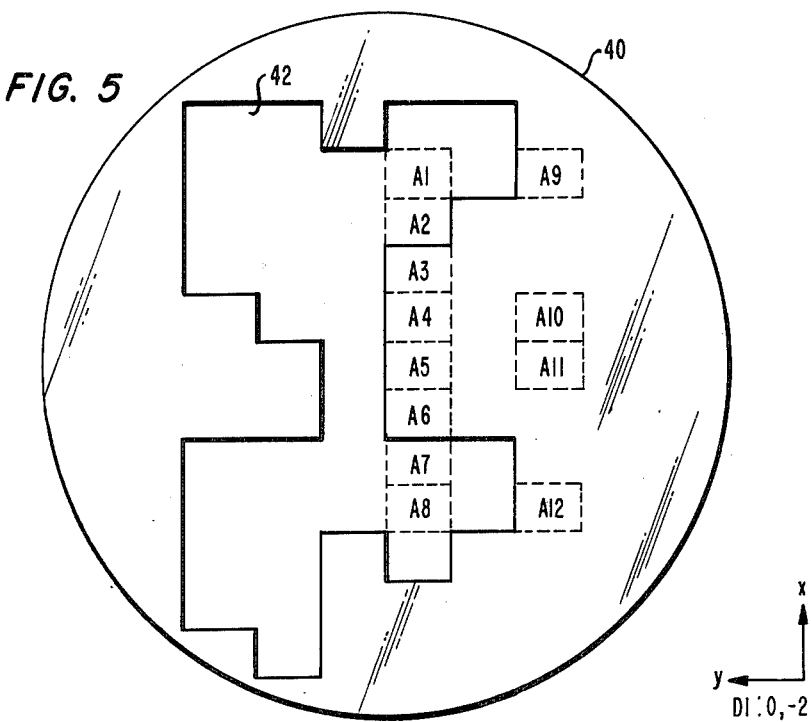
FIG. 5 shows the FIG. 3 mask plate with a deflected version of the image produced by the FIG. 2 plate superimposed thereon.

As seen in FIG. 5, only the rectangular segments A1, A2, A7 and A8 of the image formed by the apertured mask plate 26 are transmitted through the aperture 42 in the second mask plate 40. In turn, if this image is deflected by the unit 54 two half-address positions in the negative x direction and two half-address positions in the positive y direction, the registration of the segments A1, A2, A7 and A8 on the third apertured mask plate 56 is as depicted in FIG. 6. It is apparent that only the segments A1 and A2 are transmitted through the aperture 60 toward the surface of the workpiece 10. In FIG. 6, and in the representations of FIGS. 7 through 12, the stippled portion or portions of the aperture 60 indicate the particular part(s) thereof illuminated by the propagating electron beam.

In FIG. 6 and hereinafter, the x,y deflection imparted to the electron beam by the deflection unit 54 is designated by the format D2:x,y, where x and y are integers indicating the number of half-address positions that the beam has been moved in the x and y directions, respectively. Accordingly, FIG. 6 includes the designation D2:2,2.

Each solid line rectangle included in FIGS. 7 through 12 may be considered to represent the aperture 60 in the third mask plate 56 in FIG. 1. Associated with each such rectangle is a pair of deflection signal indicators designated D1, D2, which are formatted as specified above. And, as indicated earlier, the stippled portion of each rectangle represents the part thereof illuminated by the propagating electron beam.

The limited number of spot configurations represented in FIGS. 7 through 12 is simply a specific illustrative set formulated in accordance with certain criteria established therefor. Thus, for example, this particular set was devised based on the specification that constituent parts simultaneously emanating from the aperture 60 must be at least 200 $\mu$m apart in the x direction in the plane of the downstream side of the third mask plate 56. For an example of a configuration in which the constituents are exactly 200 $\mu$m apart, see FIG. 7(j). Additionally, the design rules for this set specify that only the topmost and/or bottommost rectangular segments of a spot configuration can be as small as 100 $\mu$m in the x direction. See FIG. 9(h) for an example of a configuration which includes two such 100 $\mu$m-high constituents. All other permitted spot constituents in the set depicted in FIGS. 7 through 12 measure at least 200 $\mu$m in the x direction. Significantly, the set of spot configurations shown in FIGS. 7 through 12 exhibits 0.25 $\mu$m precision in the x direction at the surface of the workpiece 10.

It is emphasized that the particular set of electron beam configurations represented in FIGS. 7 through 12 is illustrative only. In accordance with the principles of this invention, various modifications thereof can be devised.

Figure 13:
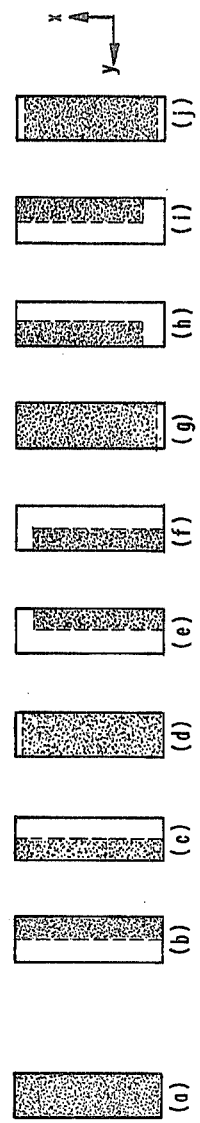
FIG. 13 shows various additional spot configurations achievable in the FIG. 1 column.

By applying appropriate deflecting and/or centering signals to the column of FIG. 1, variations of the particular configurations described above can easily be achieved. For example, the beam configurations transmitted through the third mask plate 56 of FIG. 1 can be designed to extend in the y direction less than the full width of the aperture 60. In addition, these configurations can be designed to extend in the x direction by less than the particular above-specified one-quarter-micron address size. Several such limited-extent spots are represented in FIGS. 13(b) through 13(j). Each of these spots may be considered a variant of the previously specified configuration depicted in FIG. 7(a), which is also shown in FIG. 13(a).

In accordance with an aspect of the principles of the present invention, the y or scanning-direction extent of the electron spot directed at the workpiece 10 can be varied during the scanning process. This capability is the basis for selectively varying the electron exposure level at the workpiece surface, thereby improving the sharpness of feature edges that extend in the x direction.

Ordinarily, the leading and trailing edges of an irradiated feature exhibit a ramp exposure profile. In turn, this leads as a practical matter to a lack of sharpness or definition in these edges. But, in accordance with the principles of this invention, edge sharpness in exposed features is significantly improved by controlling the herein-described system to achieve exposure profiles that are rectangular in nature. This is done by applying time-varying signals (as well as constant signals to achieve a specified spot configuration) to the unit 54 (FIG. 1) between masks 40 and 56 to continuously deflect the image transmitted through the aperture 42 in the negative y direction during selected intervals at the beginning and end of a feature exposure. Illustratively, the velocity imparted to the writing spot on the surface of the workpiece 10 by the time-varying deflection signal applied to the unit 54 is equal and opposite to that imparted to the spot by the scanning coils 78 through 81. Initially, at time $t_1$, at the leading edge of a feature, both the constant and time-varying components of the deflection signals applied to the unit 54 are turned on, whereby the image transmitted by the aperture 42 is projected onto the mask plate 56 directly adjacent the aperture 60. As the coils 78 through 81 sweep the writing spot over the workpiece 10 in the positive y direction, the time-varying component of the deflection signals continuously moves the image transmitted through the aperture 42 in the negative y direction into the aperture 60 until at $t_2$ the aperture 60 is filled with the configuration specified by the plates 26 and 40 and their respectively associated deflectors. Between $t_2$ and $t_3$ only the constant deflection signal required to produce the desired spot shape is applied to the unit 54. The beam, of course, continues to scan over the feature. At time $t_3$, the time-varying component of the deflection signals is turned on again thereby once more sweeping the image of the aperture 42 in the negative y direction, this time out of the aperture 60. Finally, at time $t_4$ the spot is blanked by this action.

In writing patterns with an EBES machine, a deliberate overlapping of feature stripes by, for example, a few tenths of a micrometer is sometimes called for in connection with the butting of adjacent stripes. But, because of the deliberate double exposure in the overlap region, a broadening occurs which tends to bridge small gaps between parallel edges crossing the butt.

In accordance with one aspect of the principles of the present invention, broadening effects during purposeful overlapping of stripe features in a lithographic process can be eliminated by selectively reducing the exposure only in the region of overlap. This is done, for example, by generating a reduced-width overlap beam tab at the beginning and/or end of each stripe to be overlapped. Thus, for example, a beam configuration of the general type depicted in FIG. 13(b) may be utilized at the beginning and/or end of a stripe having terminal portions which are to overlap other stripe portions. During nonoverlapping portions of the stripe scan, however, the beam configuration is advantageously of the full-width type depicted in FIG. 13(a). In that way, the electron exposure in overlapping regions may be controllably reduced relative to that achieved with constant-width beams, thereby to minimize broadening effects in the overlapping regions.

Embodiments of the present invention are advantageously suited to perform lithographic processing in a raster scan mode of operation of the type described in the aforecited Collier-Herriott patent. But the principles of this invention are also applicable to a lithographic system adapted to operate in a modified raster scan mode in which the beam also is vector scanned over a limited field or in effect stepped along the raster lines. Or these principles are also applicable to a system operated in a standard vector scan mode without any raster scanning. In these other modes, the deflection unit 82 shown in FIG. 1 may be utilized during specified intervals to exactly counter the y-direction deflection otherwise imparted to the electron beam by the scanning coils 78 through 81. Accordingly, during those intervals the variable-size writing electron spot is in effect held stationary on the surface of the workpiece 10. A feature to be defined on the surface is formed by abutting successive such stationary spots in a mosaic-like manner.

Figure 14:
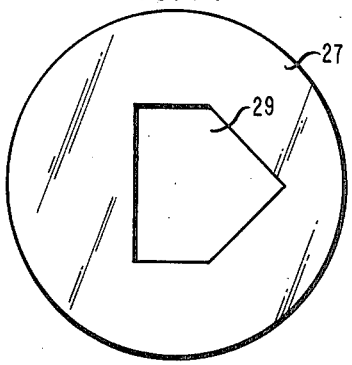
FIGS. 14 through 16 are specific illustrative depictions of the respective geometries of three other mask plates that may be included in the column shown in FIG. 1.
Figure 15:
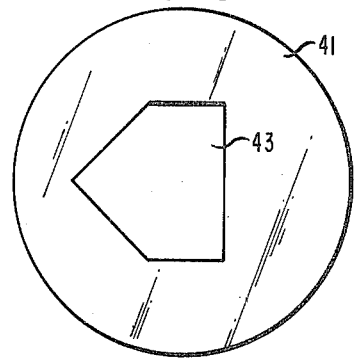
Figure 16:
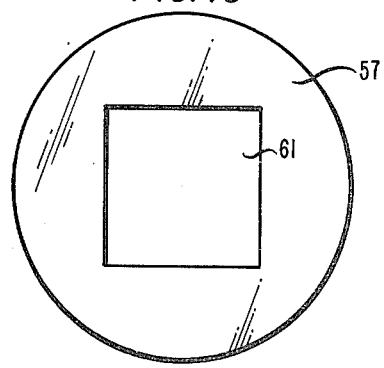

A particularly advantageous alternative pair of apertured mask plates adapted for inclusion in the illustrative column of FIG. 1 is depicted in FIGS. 14 and 15, respectively. Plate 27 with aperture 29 therethrough (FIG. 14) may be substituted for the plate 26 in FIG. 1, and plate 41 with aperture 43 (FIG. 15) may be substituted for the plate 40. In that particular case, it is further advantageous to configure the third apertured mask plate as shown in FIG. 16.

Plate 57 with aperture 61 therethrough (FIG. 16) is designed to be substituted for the plate 56 of FIG. 1 and to form a set with the particular pair of mask plates shown in FIGS. 14 and 15. Illustratively, the aperture 61 comprises a square whose size is sufficient to pass the largest image capable of being produced by the apertures 29 and 43. One particular advantage achieved by utilizing the specific set of apertured mask plates shown in FIGS. 14 through 16 is that triangular writing spots are thereby formable. As a result, it is possible in, for example, small-field vector scanning to more accurately pattern slant line-to-straight line junction regions.

Finally, it is to be understood that the above-described arrangements are only illustrative of the application of the principles of the present invention. In accordance with these principles, numerous other arrangements may be devised by those skilled in the art without departing from the spirit and scope of the invention.

I claim:

1. Apparatus for fabricating microminiature devices by selectively irradiating a radiation-sensitive layer (10) with a variable-spot-size radiant beam to define a pattern in said layer, said apparatus comprising first and second mask plates (26, 40) spaced apart from each other along a main longitudinal axis (22) or said apparatus and each having an aperture configuration therethrough, means (18) for directing a radiant beam at said first mask plate (26) to illuminate its aperture configuration (28) in its entirety, means (48) for selectively deflecting the image of the beam transmitted through the aperture configuration (28) in said first mask plate (26) to control the alignment of said image with respect to the aperture configuration (42) in said second mask plate (40) thereby to vary the cross-sectional area of the beam transmitted through said second mask plate, characterized in that said apparatus further comprises a third mask plate (56) spaced apart from said second mask plate (40) along said axis (22), means interposed between said second and third mask plates for focusing onto said third mask plate the image of the beam that appears in the plane of said second mask plate and that is transmitted through said second mask plate to form an image on said third mask plate of the cross-sectional area of the beam transmitted through said second mask plate, and means (54) for selectively deflecting the image of the beam transmitted through the aperture configuration (42) in said second mask plate (40) to control the alignment of said image with respect to the aperture configuration (60) in said third mask plate (56) thereby to vary the cross-sectional area of the beam transmitted through said third mask plate toward said radiation-sensitive layer (10).

2. Apparatus as in claim 1 further including means (64, 66, 68) for demagnifying the image that is transmitted through the aperture configuration (60) in said third mask plate (56) and for focusing said image onto said radiation-sensitive layer (10).

3. Apparatus for fabricating microminiature devices by selectively irradiating a radiation-sensitive layer (10) with a variable-spot-size radiant beam to define a pattern in said layer, said apparatus comprising first and second mask plates (26, 40) spaced apart from each other along a main longitudinal axis (22) of said apparatus and each having an aperture configuration therethrough, means (18) for directing a radiant beam at said first mask plate (26) to illuminate its aperture configuration (28) in its entirety, means (48) for selectively deflecting the image of the beam transmitted through the aperture configuration (28) in said first mask plate (26) to control the alignment of said image with respect to the aperture configuration (42) in said second mask plate (40) thereby to vary the cross-sectional area of the beam transmitted through said second mask plate.

characterized in that said apparatus further comprises a third mask plate (56) spaced apart from said second mask plate (40) along said axis (22), means (54) for selectively deflecting the image of the beam transmitted through the aperture configuration (42) in said second mask plate (40) to control the alignment of said image with respect to the aperture configuration (60) in said third mask plate (56) thereby to vary the cross-sectional area of the beam transmitted through said third mask plate toward said radiation-sensitive layer (10), means (64, 66, 68) for demagnifying the image that is transmitted through the aperture configuration (60) in said third mask plate (56) and for focusing said image onto said radiation-sensitive layer (10), and means (14) connected to said first and second mentioned deflecting means (48, 54) for applying sets or signals thereto to deflect and images along orthogonally disposed axes that are perpendicular to said main axis (22) thereby to establish for each set of signals a specified variable-spot-size image emanating from the aperture configuration (60) in said third plate (56).

4. Apparatus as in claim 3 further including means (78 through 81) for scanning said beam in a raster-scan fashion over said radiation-sensitive layer (10) along plural scan lines each of which has a multiplicity of address locations therealong.

5. Apparatus as in claim 4 wherein the aperture configurations (28, 42, 60) in said first, second and third mask plates (26, 40, 56) are respectively different.

6. Apparatus as in claim 3 further including means (82) for scanning said beam in a vector-scan fashion over said radiation-sensitive layer.

7. Apparatus as in claim 6 wherein the aperture configurations (28, 42) in said first and second mask plates (26, 40) are the same and the aperture configuration (60) in said third mask plate (56) is different therefrom.

8. Apparatus for scanning a variable-spot-size radiant beam over a work surface to irradiate selected portions of the surface in connection with the fabrication of a microminiature device, said apparatus comprising first, second and third mask plates spaced apart from each other along a main longitudinal axis of said apparatus and each having an aperture configuration therethrough, means for directing a radiant beam at said first mask plate to illuminate in its entirety the aperture configuration therethrough, means interposed between said first and second mask plates and between said second and third mask plates for focusing onto said second mask plate the image of the beam that appears in the plane of said first mask plate and that is transmitted through said first mask plate and for focusing onto said third mask plate the image of the beam that appears in the plane of said second mask plate and that is transmitted through said second mask plate, and means interposed between said first and second mask plates and between said second and third mask plates for deflecting the image of the beam transmitted through the aperture configuration in said first plate with respect to the aperture configuration in said second plate and for deflecting the image of the beam transmitted through the aperture configuration in said second plate with respect to the aperture configuration in said third plate to illuminate any specified portion or the aperture configuration in said third plate thereby to define a variable-spot-size beam for propagation toward said work surface.

9. Apparatus as in claim 8 further including means for demagnifying the image transmitted through the aperture configuration in said third plate and for focusing said image onto said work surface, and means for scanning said demagnified and focused image over said work surface to selectively irradiate portions thereof.

10. Apparatus for scanning a variable-spot-size radiant beam over a work surface to irradiate selected portions of the surface in connection with the fabrication of a microminiature device, said apparatus comprising first, second and third mask plates spaced apart from each other along a main longitudinal axis of said apparatus and each having an aperture configuration therethrough, means for directing a radiant beam at said first mask plate to illuminate in its entirety the aperture configuration therethrough, means interposed between said first and second mask plates and between said second and third mask plates for deflecting the image of the beam transmitted through the aperture configuration in said first plate with respect to the aperture configuration in said second plate and for deflecting the image of the beam transmitted through the aperture configuration in said second plate with respect to the aperture configuration in said third plate to illuminate any specified portion of the aperture configuration in said third plate thereby to define a variable-spot-size beam for propagation toward said work surface, means for demagnifying the image transmitted through the aperture configuration in said third plate and for focusing said image onto said work surface, and means for scanning said demagnified and focused image over said work surface to selectively irradiate portions thereof, wherein the aperture configuration in said third mask plate comprises a single rectangular opening therethrough, and wherein said apparatus further comprises means for controlling said deflecting means to cause said beam to illuminate at least one variable-width portion of said rectangular opening during specified scanning intervals.

11. Apparatus as in claim 10 further comprising means for projecting the image of the beam transmitted through the first mask plate onto the second mask plate and for projecting the image of the beam transmitted through the second mask plate onto the third mask plate.

12. A method for fabricating microminiature devices by the technique of scanning a variable-spot-size radiant beam over a work surface to irradiate selected portions of the surface in accordance with a prescribed pattern, said method comprising the steps of directing a radiant beam at a first mask plate which includes an aperture configuration therethrough to illuminate said configuration in its entirety, focusing an image of the beam that appears in the plane of said first mask plate and that is transmitted through the aperture configuration in said first mask plate onto a second mask plate which includes an aperture configuration therethrough to align said image in a specified relationship with respect to the aperture configuration in said second mask plate whereby only that portion of the image that overlies the aperture configuration in said second mask plate is transmitted through said second mask plate, and focusing the image that appears in the plane of said second mask plate and that is transmitted through the second mask plate onto a third mask plate which includes an aperture configuration therethrough to align said last-mentioned image in a specified relationship with respect to the aperture configuration in said third mask plate whereby only that portion of said last-mentioned image that overlies the aperture configuration in said third mask plate is transmitted through said third mask plate toward said work surface.

13. A method as in claim 12 further including the step of scanning said beam over said surface in a vector-scan mode of operation.

14. A method for fabricating microminiature devices by the technique of scanning a variable-spot-size radiant beam over a work surface to irradiate selected portions of the surface in accordance with a prescribed pattern, said method comprising the steps of directing a radiant beam at a first mask plate which includes an aperture configuration therethrough to illuminate said configuration in its entirety, directing an image of the beam transmitted through the aperture configuration in said first mask plate onto a second mask plate which includes an aperture configuration therethrough to align said image in a specified relationship with respect to the aperture configuration in said second mask plate whereby only that portion of the image that overlies the aperture configuration in said second mask plate is transmitted through said second mask plate, directing the image transmitted through the second mask plate onto a third mask plate which includes an aperture configuration therethrough to align said last-mentioned image in a specified relationship with respect to the aperture configuration in said third mask plate whereby only that portion of said last-mentioned image that overlies the aperture configuration in said third mask plate is transmitted through said third mask plate toward said work surface, scanning said beam over said surface along successive scan lines in a raster-scan mode of operation, and intensity modulating said beam at each address position of a scan line.

15. A method as in claim 14 further including the step of controlling said directing steps to illuminate the aperture configuration in said third mask plate less than a standard prescribed width thereof in the direction of scanning during intervals in which overlapping portions of the surface are being irradiated.

16. A method as in claim 14 further including the step of controlling said first-mentioned directing step to continuously deflect the image transmitted through the aperture configuration in the second mask plate in a direction opposite to the scanning direction during selected intervals at the beginning and end of an irradiated surface portion to achieve edge sharpness of said portion.

* * * * *

UNITED STATES PATENT AND TRADEMARK OFFICE
CERTIFICATE OF CORRECTION

PATENT NO. : 4,167,676
DATED : September 11, 1979
INVENTOR(S) : Robert J. Collier It is certified that error appears in the above-identified patent and that said Letters Patent are hereby corrected as shown below:

Column 1, lines 16 and 17, "re-sistcoated", should read --resist-coated--. Column 3, line 2, "parts", should read --part--; line 64, "20", should read --30--. Column 4, line 42, "lines", should read --lens--; line 48, "lines", should read --lens--. Column 5, line 52, "registraton", should read --registration--. Column 7, line 15, "enits", should read --units--; line 21, "X and/or Y", should read --x and/or y--; line 66, "D2:2,2", should read --D2:-2,2--. Column 10, line 7, "in", should read --of--. Column 11, line 42 "or" should read --of--; line 42, "and", should read --said--.

Signed and Sealed this

First Day of January 1980

[SEAL]

Attest:

SIDNEY A. DIAMOND

Attesting Officer

Commissioner of Patents and Trademarks